(12) United States Patent
Lu

(10) Patent No.: US 12,225,708 B2
(45) Date of Patent: Feb. 11, 2025

(54) SEMICONDUCTOR DEVICE, METHOD OF MANUFACTURING SEMICONDUCTOR DEVICE AND ELECTRONIC DEVICE

(71) Applicant: CHANGXIN MEMORY TECHNOLOGIES, INC., Hefei (CN)

(72) Inventor: Jingwen Lu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 467 days.

(21) Appl. No.: 17/651,279

(22) Filed: Feb. 16, 2022

(65) Prior Publication Data

US 2023/0046960 A1   Feb. 16, 2023

Related U.S. Application Data

(63) Continuation of application No. PCT/CN2021/113595, filed on Aug. 19, 2021.

(30) Foreign Application Priority Data

Aug. 16, 2021  (CN) .......................... 202110934847.7

(51) Int. Cl.
*H10B 12/00* (2023.01)
(52) U.S. Cl.
CPC ........... *H10B 12/053* (2023.02); *H10B 12/34* (2023.02)
(58) Field of Classification Search
None
See application file for complete search history.

(56) References Cited

U.S. PATENT DOCUMENTS

| 8,610,203 | B2 | 12/2013 | Kim | |
|---|---|---|---|---|
| 2012/0039104 | A1 | 2/2012 | Lin et al. | |
| 2019/0259839 | A1* | 8/2019 | Ryu | H10B 12/053 |
| 2020/0203351 | A1* | 6/2020 | Chae | H10B 12/488 |
| 2022/0216210 | A1* | 7/2022 | Wei | H10B 12/315 |

FOREIGN PATENT DOCUMENTS

| CN | 102214578 A | 10/2011 |
|---|---|---|
| CN | 105097641 A | 11/2015 |
| CN | 109148376 A | 1/2019 |
| CN | 111048467 A | 4/2020 |

OTHER PUBLICATIONS

International Search Report cited in PCT/CN2021/113595 mailed Apr. 28, 2022, 9 pages.

* cited by examiner

*Primary Examiner* — Hsien Ming Lee
(74) *Attorney, Agent, or Firm* — Syncoda LLC; Feng Ma

(57) ABSTRACT

The present disclosure provides a semiconductor device, a method of manufacturing a semiconductor device and an electronic device. The method of manufacturing a semiconductor device includes: forming word line trenches on a semiconductor substrate, forming a word line structure in each of the word line trenches, and finally forming active regions. The word line trenches pass through the semiconductor substrate without passing through other material.

14 Claims, 18 Drawing Sheets

SEMICONDUCTOR DEVICE, METHOD OF MANUFACTURING SEMICONDUCTOR DEVICE AND ELECTRONIC DEVICE

CROSS-REFERENCE TO RELATED APPLICATIONS

This is a continuation of International Patent Application No. PCT/CN2021/113595, filed on Aug. 19, 2021, which claims the priority to Chinese Patent Application No. 202110934847.7, titled "SEMICONDUCTOR DEVICE, METHOD OF MANUFACTURING SEMICONDUCTOR DEVICE AND ELECTRONIC DEVICE" and filed to China National Intellectual Property Administration (CNIPA) on Aug. 16, 2021. The entire contents of International Patent Application No. PCT/CN2021/113595 and Chinese Patent Application No. 202110934847.7 are incorporated herein by reference.

TECHNICAL FIELD

The present disclosure relates to the technical field of storage, in particular to a semiconductor device, a method of manufacturing a semiconductor device and an electronic device.

BACKGROUND

As a commonly used semiconductor memory in computers, dynamic random access memory (DRAM) is composed of many repeated memory cells. Each memory cell typically includes a capacitor and a transistor. In the transistor, the gate is connected to a word line, the drain is connected to a bit line, and the source is connected to the capacitor. The voltage signal on the word line controls the transistor to be turned on or off, so as to read data information stored in the capacitor through the bit line or write data information into the capacitor through the bit line.

Currently, buried word lines are used to avoid interference between word lines. Typically, a fabrication method of the buried word lines includes: providing a semiconductor substrate, forming shallow trench isolation (STI) regions on the semiconductor substrate to define active regions, filling the STI regions with silicon oxide, etching the semiconductor substrate to form word line trenches passing through the active regions and the silicon oxide in the STI regions, and forming buried word lines in the word line trenches. The semiconductor substrate and the silicon oxide have a problem of etch selectivity, that is, they have different etch rates. Therefore, the word line trenches are formed with uneven bottom surfaces, resulting in that the buried word lines are formed with uneven bottom surfaces, which will affect the performance and reliability of the semiconductor device.

SUMMARY

A first aspect of some embodiments of the present disclosure provides a method of manufacturing a semiconductor device. The method of manufacturing a semiconductor device includes the following steps:
  forming multiple word line trenches on a semiconductor substrate, where the word line trenches extend in a first direction;
  forming a word line structure in each of the word line trenches, where a top surface of the word line structure is flush with a top surface of the semiconductor substrate;
  forming multiple active region mask structures on the top surface of the semiconductor substrate, where the active region mask structures define active regions in the semiconductor substrate; and orthographic projection of the active region mask structures on a bottom surface of the semiconductor substrate extends in a second direction and passes through orthographic projection of the word line structures on the bottom surface of the semiconductor substrate; and
  etching the word line structures and the semiconductor substrate by using the active region mask structures as an etch mask to form the active regions and buried word lines passing through the active regions.

A second aspect of some embodiments of the present disclosure provides a semiconductor device, which is manufactured by the above-mentioned method of manufacturing a semiconductor device, and includes:
  a semiconductor substrate, provided with isolation regions formed by shallow trench isolation trenches and multiple active regions defined by the isolation regions; and
  multiple buried word lines, buried in word line trenches formed by etching the semiconductor substrate, wherein the buried word lines intersect with the corresponding active regions.

A third aspect of some embodiments of the present disclosure provides an electronic device, including the above-mentioned semiconductor device.

DETAILED DESCRIPTION

Figure 1A:
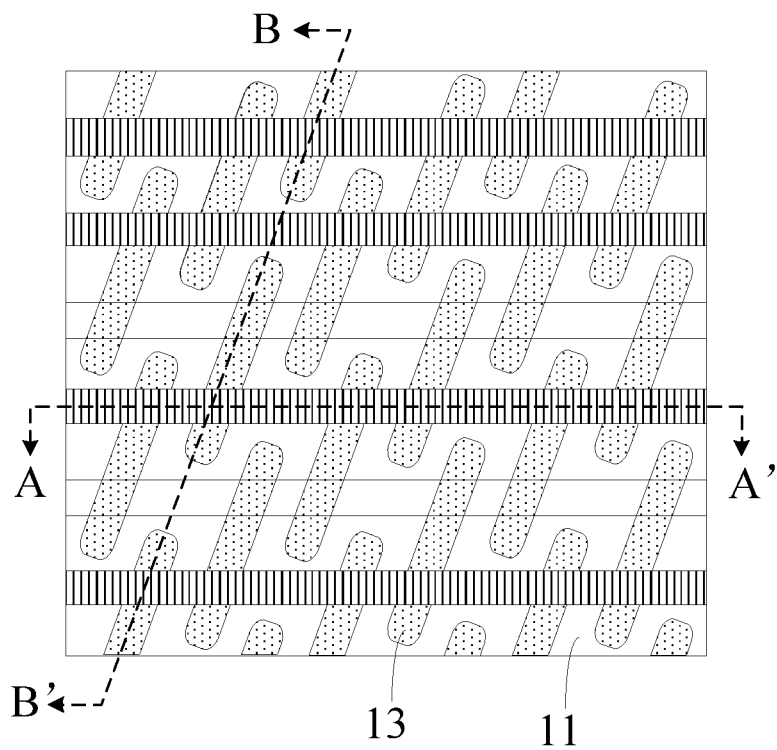
FIG. 1A is a top view illustrating a structure of a semiconductor device in the related art.

In order to make the objectives, technical solutions and advantages of the embodiments of the present disclosure clearer, the technical solutions in the embodiments of the present disclosure are clearly and completely described below with reference to the drawings in the embodiments of the present disclosure. Apparently, the described embodiments are part rather than all of the embodiments of the present disclosure. The embodiments in the present disclosure and features in the embodiments may be combined with each other in a non-conflicting manner. All other embodiments obtained by those of ordinary skill in the art based on the described embodiments of the present disclosure without creative efforts should fall within the protection scope of the present disclosure.

Unless otherwise defined, the technical or scientific terms used herein should have the usual meanings understood by those of ordinary skill in the field to which the present disclosure belongs. Terms such as "first" and "second" used herein do not denote any order, quantity or importance, but are merely intended to distinguish between different constituents. Terms such as "include" or "comprise" means that the element or item appearing before the term encompass the elements or items listed after the term and their equivalents, without excluding other elements or items. Terms such as "connected to" and "connected with" are not restricted to physical or mechanical connections, but may also include electrical connections, whether direct or indirect.

It should be noted that the size and shape of each figure in the drawings do not reflect the true ratio, but are intended to illustrate the present disclosure. The same or similar reference numerals in the specification represent the same or similar elements or those having the same or similar functions.

Figure 1B:
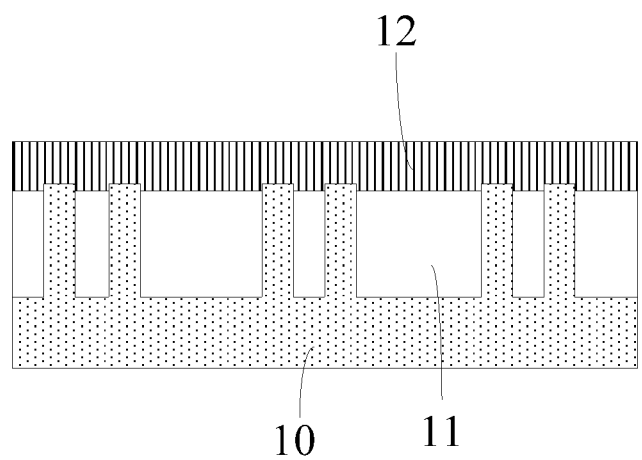
FIG. 1B is a sectional view illustrating a structure of the semiconductor device along AA' in FIG. 1A.
Figure 1C:
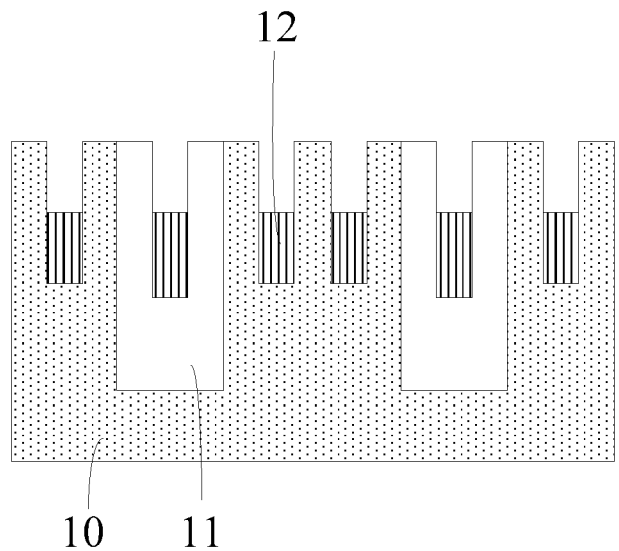
FIG. 1C is a sectional view illustrating a structure of the semiconductor device along BB' in FIG. 1A.
Figure 2:
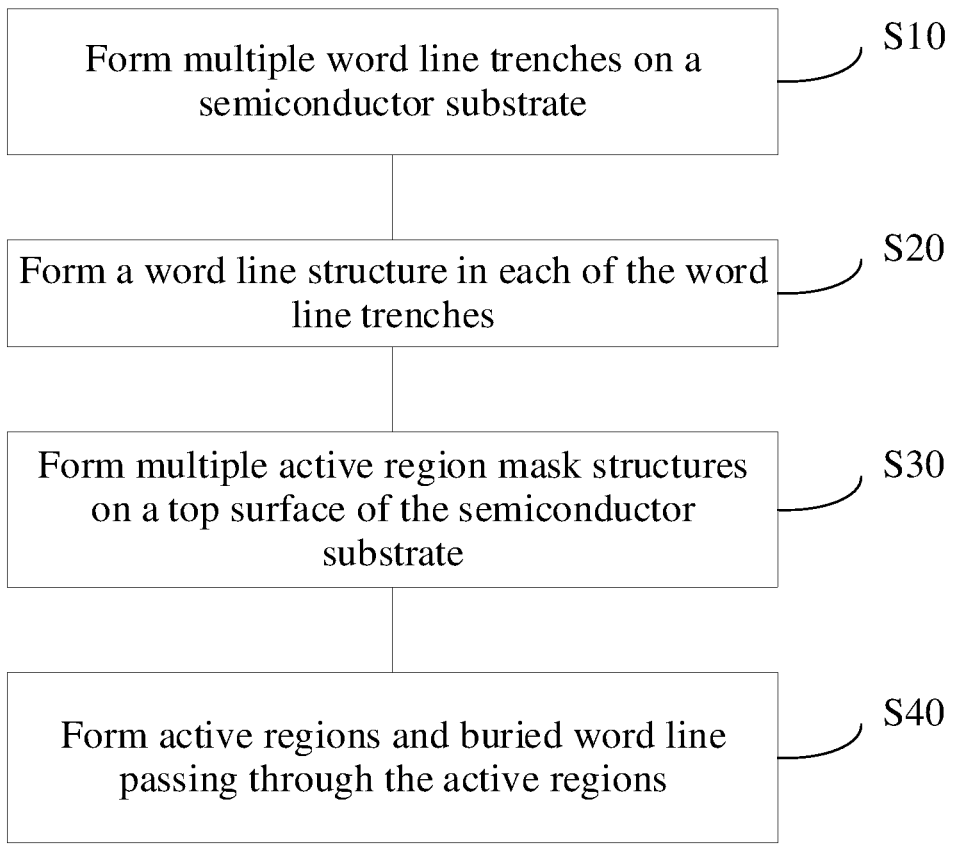
FIG. 2 is a flowchart of a method of manufacturing a semiconductor device according to an embodiment of the present disclosure.

Buried word lines 132 are used in order to avoid interference between word lines. Referring to FIGS. 1A to 1C, FIG. 1A is a top view illustrating a structure of a semiconductor device in the related art; FIG. 1B is a sectional view illustrating a structure of the semiconductor device along AA' in FIG. 1A; and FIG. 1C is a sectional view illustrating a structure of the semiconductor device along BB' in FIG. 1A. Typically, a fabrication method of the buried word lines includes: provide a semiconductor substrate 10, form shallow trench isolation (STI) regions on the semiconductor substrate 10 to define active regions 13, fill the STI regions with silicon oxide 11, etch the semiconductor substrate 10 to form word line trenches passing through the active regions and the silicon oxide in the STI regions, and form buried word lines 12 in the word line trenches. The word line trenches pass through both the semiconductor substrate 10 and the silicon oxide 11 in the STI regions. The semiconductor substrate 10 and the silicon oxide 11 have a problem of etch selectivity, that is, they have different etch rates. Therefore, the word line trenches are formed with an uneven bottom surface, resulting in that the buried word lines 12 are formed with an uneven bottom surface, which will affect the performance and reliability of the semiconductor device.

In view of this, an embodiment of the present disclosure provides a method of manufacturing a semiconductor device. The fabrication method forms word line trenches 101 on a semiconductor substrate 100, forms word line structures 130 in the word line trenches 101, and finally forms active regions. The word line trenches 101 pass through the semiconductor substrate 100 without passing through other material. Since the material of the semiconductor substrate 100 is uniform, there is no problem of etch selectivity, and the word line trenches 101 are formed with an even bottom surface. When the word line structures 130 are formed in the word line trenches 101, the word line structures 130 are in direct contact with the semiconductor substrate 100. Since there is no need to contact the word line structures 130 with other material, the word line structures 130 are formed with an even bottom surface. In this way, buried word lines are also formed with an even bottom surface, thereby improving the performance and reliability of the semiconductor device.

Referring to FIGS. 2 and 3A to 14C, FIG. 2 is a flowchart of a method of manufacturing a semiconductor device according to an embodiment of the present disclosure; and FIGS. 3A to 14B are views illustrating structures obtained by implementing various steps of the method of manufacturing a semiconductor device according to the embodiment of the present disclosure. In this embodiment, the method of manufacturing a semiconductor device includes the following steps:

S10: Form multiple word line trenches 101 on a semiconductor substrate 100.

In some examples, the material of the semiconductor substrate 100 may include silicon, germanium or silicon-on-insulator (SOI), or include silicon-germanium, silicon carbide or other known materials, for example, group III and V compounds such as gallium arsenide. Certain dopant ions may also be implanted into the semiconductor substrate 100 according to design requirements so as to change electrical parameters. In some embodiments, the semiconductor substrate 100 may be a silicon substrate.

In some examples, the S10: form multiple word line trenches 101 on a semiconductor substrate 100 may specifically include the following step. First, a trench mask layer covering the semiconductor substrate 100 is formed on the semiconductor substrate 100. The trench mask layer may be made of one or more from the group consisting of silicon oxide, silicon nitride, oxynitride, silicon nitride and oxide/nitride/oxide (ONO). In some embodiments, a silicon nitride layer is deposited as the trench mask layer at a set deposition rate. The deposition process may be chemical vapor deposition (CVD), physical vapor deposition (PVD), atomic layer deposition (ALD), high-density plasma chemical vapor deposition (HDPCVD), metal organic chemical vapor deposition (MOCVD), plasma enhanced chemical vapor deposition (PECVD) or other suitable deposition process well known to those skilled in the art, which is not limited herein. Similarly, the deposition rate and the thickness of the trench mask layer are determined by those skilled in the art according to actual needs. It should be noted that the subsequent deposition process may also be CVD, PVD, ALD, HDPCVD, MOCVD, PECVD or other suitable deposition process well known to those skilled in the art, which will not be repeated here.

Figure 3A:
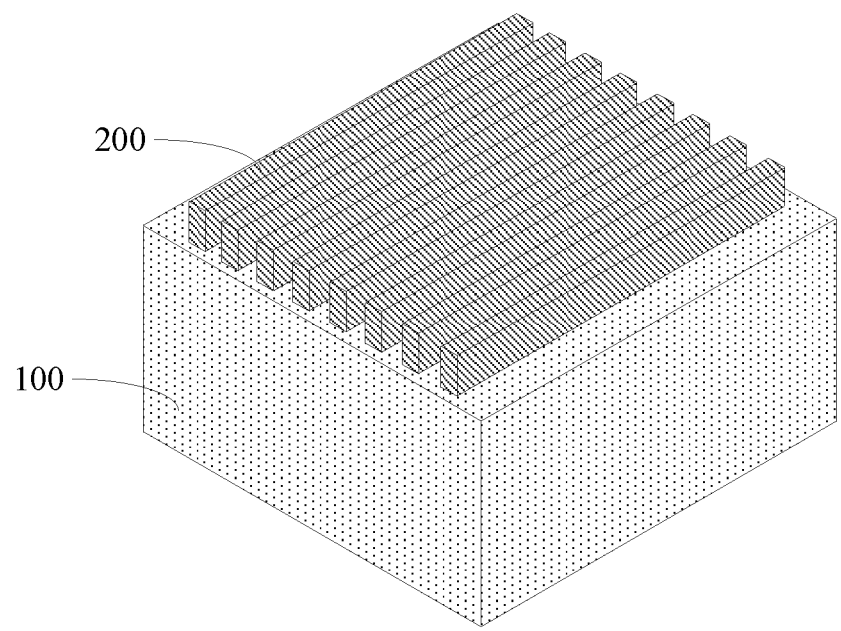
FIG. 3A is a view illustrating a first structure obtained by the method of manufacturing a semiconductor device according to an embodiment of the present disclosure.
Figure 3B:
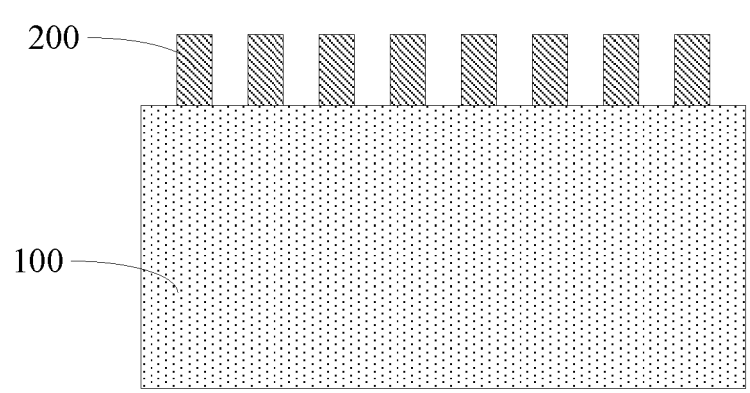
FIG. 3B is a sectional view illustrating the structure shown in FIG. 3A.

Then, referring to FIGS. 3A and 3B, the trench mask layer is patterned to form multiple stripe-shaped trench mask structures 200 extending in a first direction F1. In some embodiments, the trench mask layer on regions where the word line trenches 101 are to be formed may be removed by a vapor etching process, and the trench mask layer on the remaining regions may be retained to form multiple stripe-shaped trench mask structures 200 extending in the first direction F1. There is a gap between adjacent trench mask structures 200 to expose the semiconductor substrate 100 in regions where the word line trenches 101 are to be formed. In some embodiments, to achieve certain etch selectivity to etch the trench mask layer, an etching gas used may be one or more from the group consisting of $SF_6$, $CF_4$, $Cl_2$, $CHF_3$, $O_2$ and Ar.

Figure 4A:
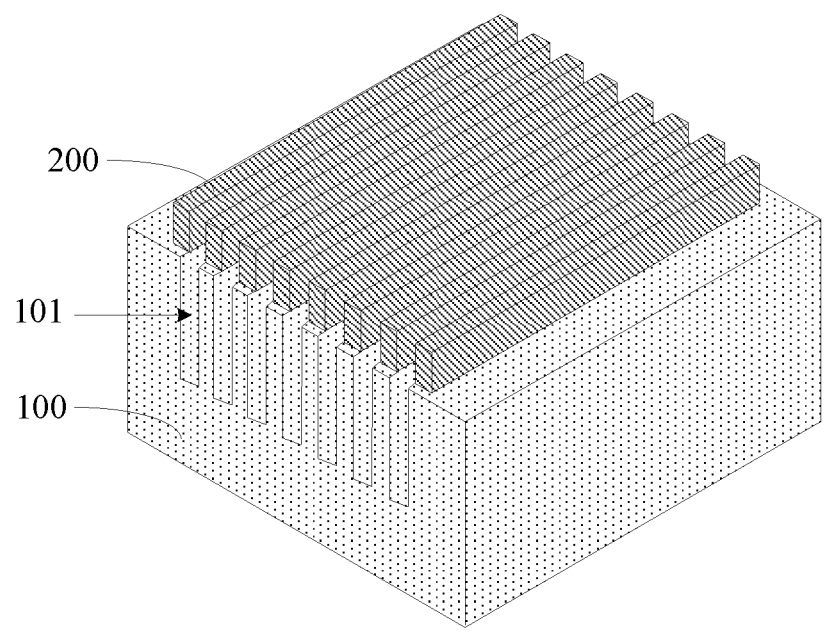
FIG. 4A is a view illustrating a second structure obtained by the method of manufacturing a semiconductor device according to an embodiment of the present disclosure.
Figure 4B:
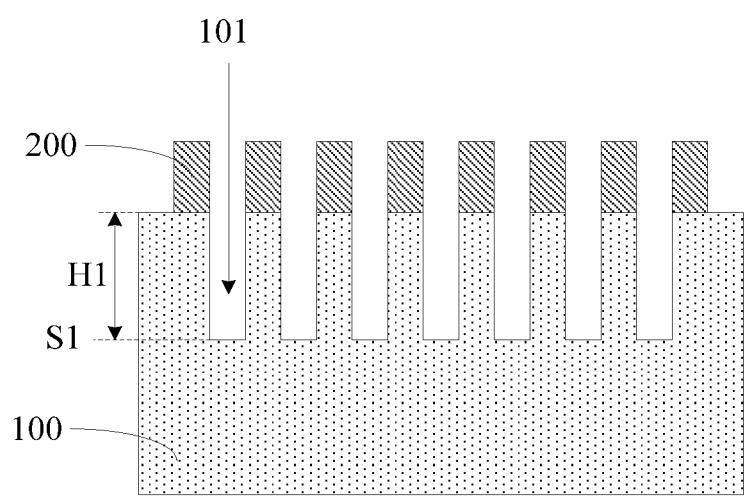
FIG. 4B is a sectional view illustrating the structure shown in FIG. 4A.

Referring to FIGS. 4A and 4B, the semiconductor substrate 100 in the gap between the adjacent trench mask structures 200 is removed by a set height to form multiple word line trenches 101 extending in the first direction F1. In some embodiments, the semiconductor substrate 100 exposed in the gap between the adjacent trench mask structures 200 is etched by a vapor etching process by using an etching gas, which may be one or more from the group consisting of $SF_6$, $CF_4$, $Cl_2$, $CHF_3$, $O_2$ and Ar to achieve certain etch selectivity. The semiconductor substrate 100 is etched by a set height to form the word line trenches 101.

Since the semiconductor substrate 100 is etched by a vapor etching process, the word line trenches 101 are formed in the semiconductor substrate 100 without passing through other material. In this way, the word line trenches 101 have a substantially equal depth H1, and bottom surfaces S1 of the word line trenches 101 are as even as possible.

It should be noted that in the actual process, due to the limitation of process conditions or other factors, the bottom surfaces S1 of the word line trenches 101 may not be completely flush, and there may be some deviations. Therefore, the evenness of the bottom surfaces S1 of the word line trenches 101 falls within the protection scope of the present disclosure as long as it substantially satisfies the above-mentioned condition. For example, the evenness of the bottom surfaces S1 of the word line trenches 101 is satisfactory within an error tolerance range.

Figure 5A:
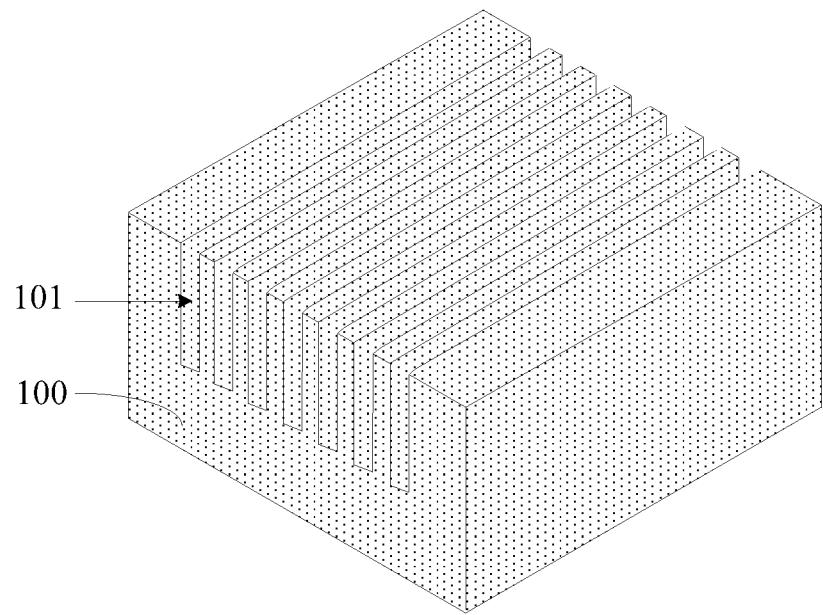
FIG. 5A is a view illustrating a third structure obtained by the method of manufacturing a semiconductor device according to an embodiment of the present disclosure.
Figure 5B:
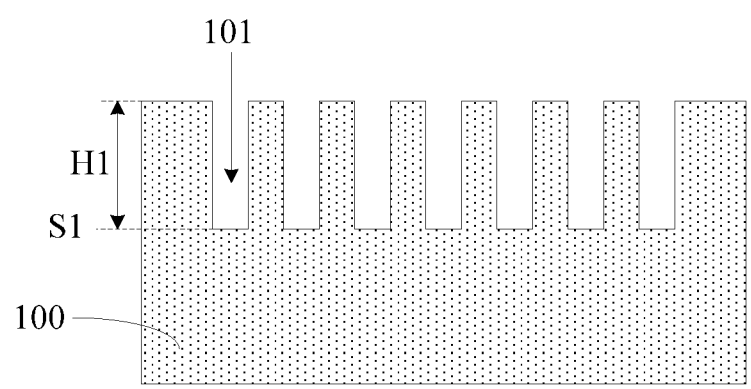
FIG. 5B is a sectional view illustrating the structure shown in FIG. 5A.
Figure 6A:
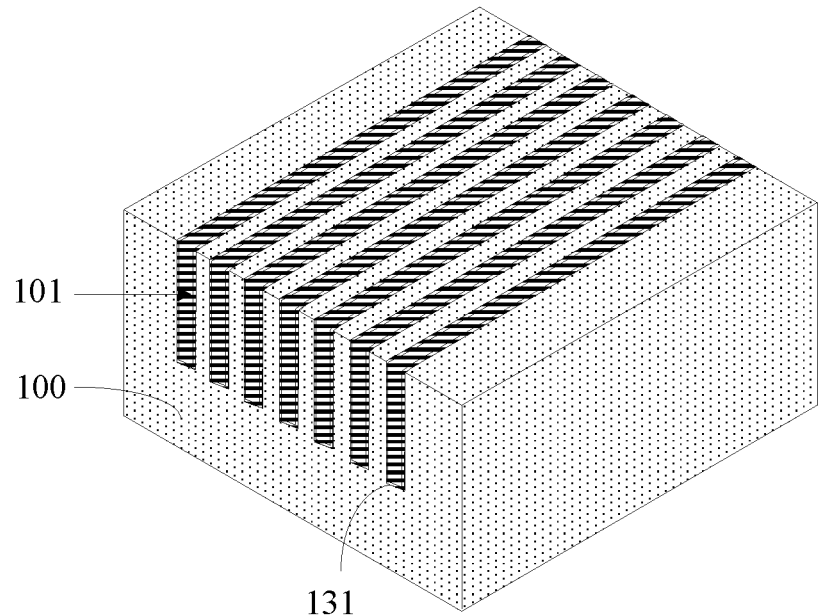
FIG. 6A is a view illustrating a third structure obtained by the method of manufacturing a semiconductor device according to an embodiment of the present disclosure.
Figure 6B:
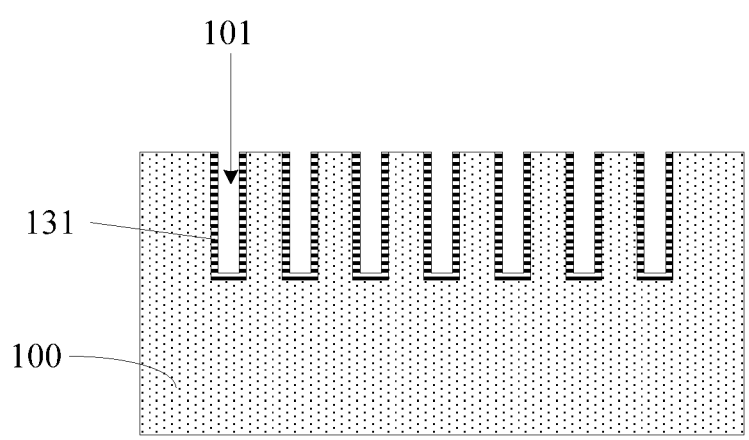
FIG. 6B is a sectional view illustrating the structure shown in FIG. 6A.

Referring to FIGS. 5A and 5B, the trench mask structures 200 are removed by etching.

S20: Form a word line structure 130 in each of the word line trenches 101. The bottom surfaces of the formed word line structures 130 are as flush as possible.

In some examples, referring to FIGS. 6A to 8B, top surfaces of the word line structures 130 are flush with a top surface of the semiconductor substrate 100, and bottom surfaces of the word line structures 130 are formed on the bottom surfaces S1 of the word line trenches 101. The bottom surfaces of the word line structures 130 are in contact with the semiconductor substrate 100, and the bottom surfaces of the word line structures 130 are as flush as possible.

In some examples, the word line structures 130 each may include: a gate dielectric layer 131 formed on sidewalls of the word line trench 101, a buried word line 132 filled in the word line trench 101 with the gate dielectric layer 131 and an insulating layer 133 filled on the buried word line 132 in the word line trench 101. Since the bottom surfaces of the word line trenches 101 are as even as possible, the bottom surfaces of the word line trenches 101 with the gate dielectric layer attached to the sidewalls are also as even as possible. In this way, the bottom surfaces of the formed buried word lines 132 are as flush as possible, thereby reducing interference and improving the performance and reliability of the semiconductor device.

In some examples, the S20: form a word line structure 130 in each of the word line trenches 101 may specifically include the following step. First, referring to FIGS. 6A and 6B, the gate dielectric layer 131 is formed on the sidewalls of each of the word line trenches 101. In some embodiments, the material of the gate dielectric layer 131 may include one or more from the group consisting of silicon oxide, silicon nitride, oxynitride, silicon-based nitride, ONO and a high-dielectric-constant material. For example, the sidewalls of the word line trench 101 may be covered with silicon oxide by ALD to form the gate dielectric layer 131.

Figure 7A:
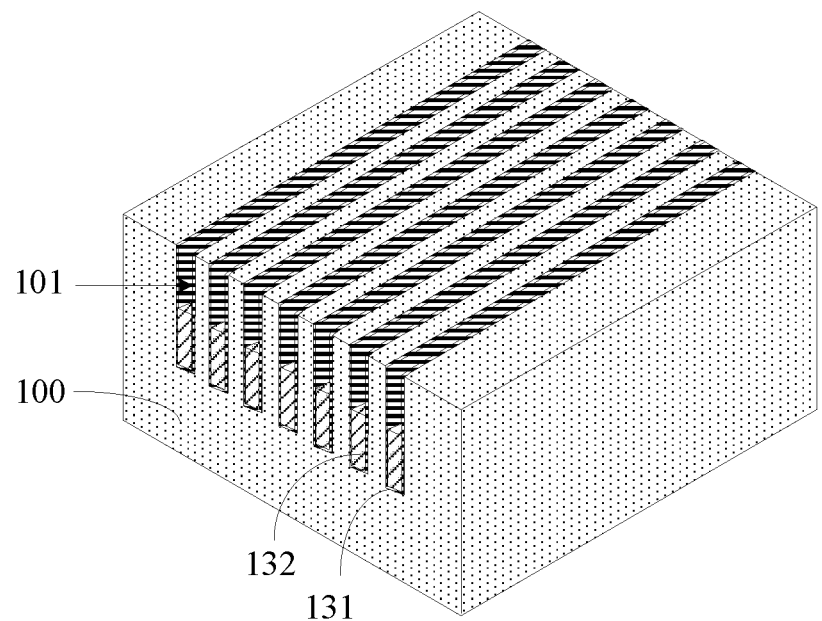
FIG. 7A is a view illustrating a third structure obtained by the method of manufacturing a semiconductor device according to an embodiment of the present disclosure.
Figure 7B:
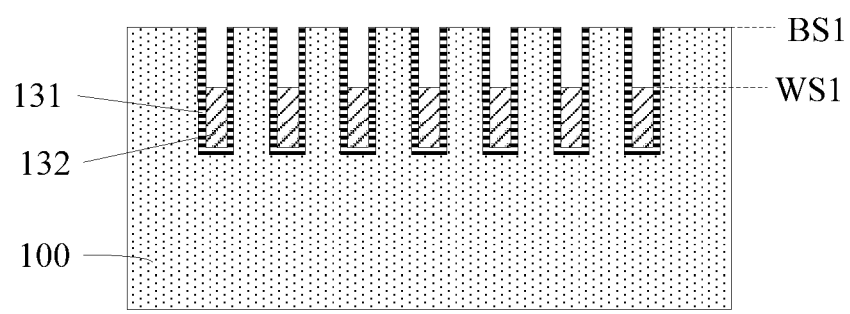
FIG. 7B is a sectional view illustrating the structure shown in FIG. 7A.

Referring to FIGS. 7A and 7B, the buried word line 132 is filled in the word line trench 101 forming the gate dielectric layer 131, and a top surface WS1 of the formed buried word line 132 is lower than a top surface BS1 of the semiconductor substrate 100. In some embodiments, the material of the buried word line 132 may include one or more from the group consisting of Ti, TiN, Ta, TaN, W, WN, TiSiN and WSiN. For example, TiN/W may be deposited in the word line trench 101 through CVD, PVD, ALD, HDPCVD, MOCVD, PECVD or other suitable deposition process. The TiN/W deposited in the word line trench 101 is etched to a desired height through an etching process to form the buried word line 132 with the top surface WS1 lower than the top surface BS1 of the semiconductor substrate 100.

Figure 8A:
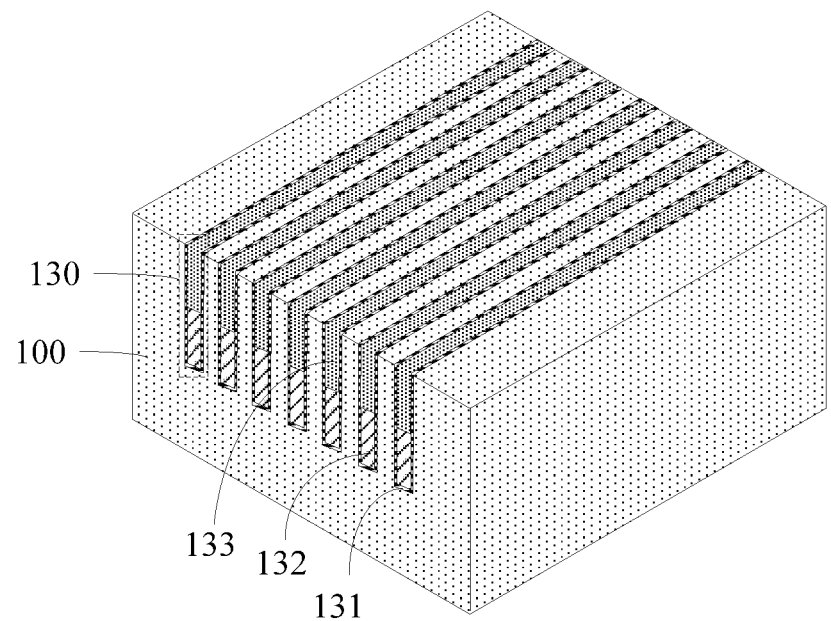
FIG. 8A is a view illustrating a third structure obtained by the method of manufacturing a semiconductor device according to an embodiment of the present disclosure.
Figure 8B:
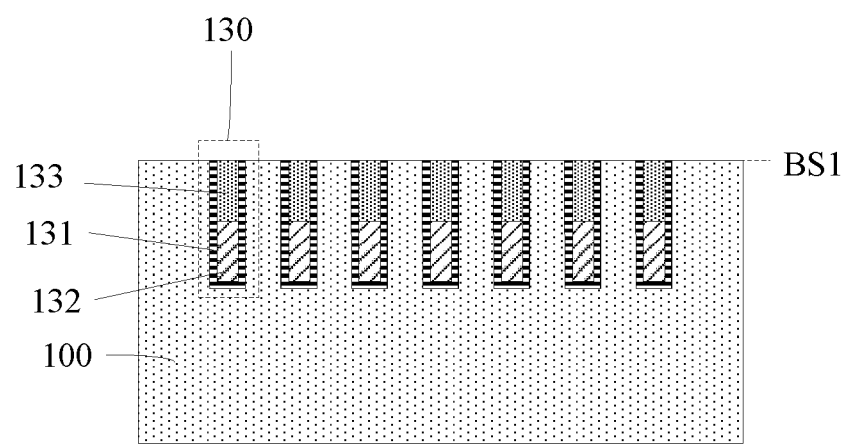
FIG. 8B is a sectional view illustrating the structure shown in FIG. 8A.

Referring to FIGS. 8A and 8B, the insulating layer 133 is filled on the buried word line 132 in the word line trench 101, and a top surface of the formed insulating layer 133 is flush with the top surface BS1 of the semiconductor substrate 100. In some embodiments, the material of the insulating layer 133 may include one or a combination of two or more of the group consisting of silicon oxide, silicon nitride, silicon oxynitride and silicon-based oxynitride. For example, silicon nitride may be deposited as the insulating layer 133 in the word line trench 101 or the semiconductor substrate 100 with the buried word line 132 through CVD, PVD, ALD, HDPCVD, MOCVD, PECVD or other suitable deposition process. The insulating layer 133 is etched through an etching process, such that a top surface of the insulating layer 133 and the top surface BS1 of the semiconductor substrate 100 are even. Alternatively, in order to make the top surfaces of the semiconductor substrate 100 and the insulating layer 133 even, both the insulating layer 133 and the semiconductor substrate 100 may be etched, such that an upper surface of the etched insulating layer 133 and the semiconductor substrate 100 as a whole is as even as possible.

S30: Form multiple active region mask structures 300 on the top surface of the semiconductor substrate 100.

In some examples, referring to FIGS. 9A to 10C, the active region mask structures 300 define active regions in the semiconductor substrate 100. In other words, orthographic projection of the active region mask structures 300 on a bottom surface of the semiconductor substrate 100 overlaps with orthographic projection of the active regions on the bottom surface of the semiconductor substrate 100. In this way, when the semiconductor substrate 100 in unmasked regions is subsequently etched, the semiconductor substrate 100 under the active region mask structures 300 can be retained as active regions.

Figure 10A:
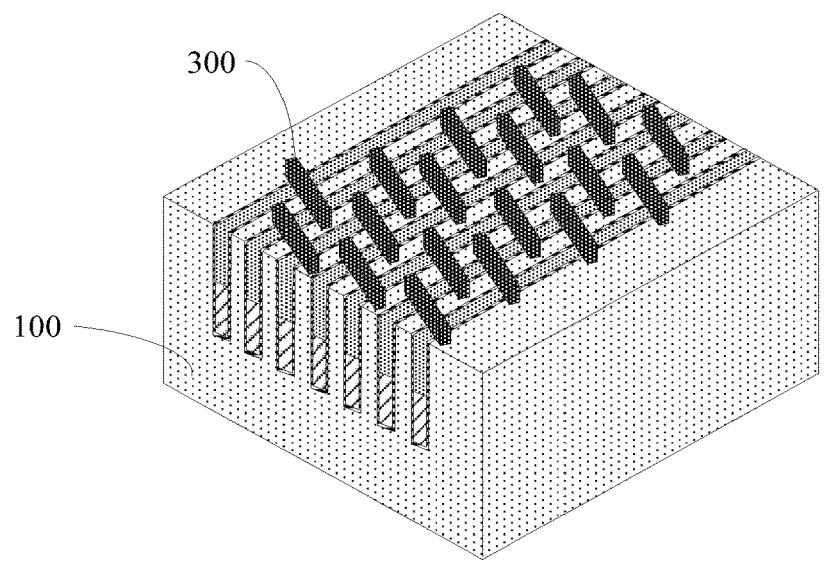
FIG. 10A is a view illustrating a third structure obtained by the method of manufacturing a semiconductor device according to an embodiment of the present disclosure.
Figure 10B:
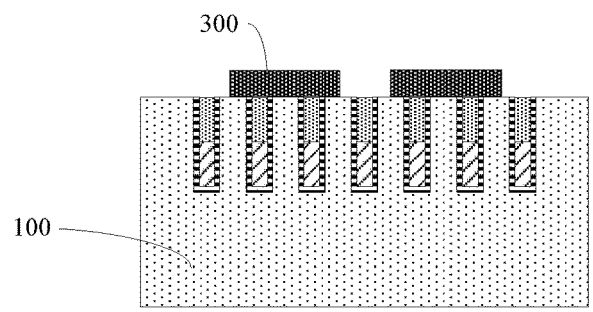
FIG. 10B is a sectional view illustrating the structure shown in FIG. 10A.
Figure 10C:
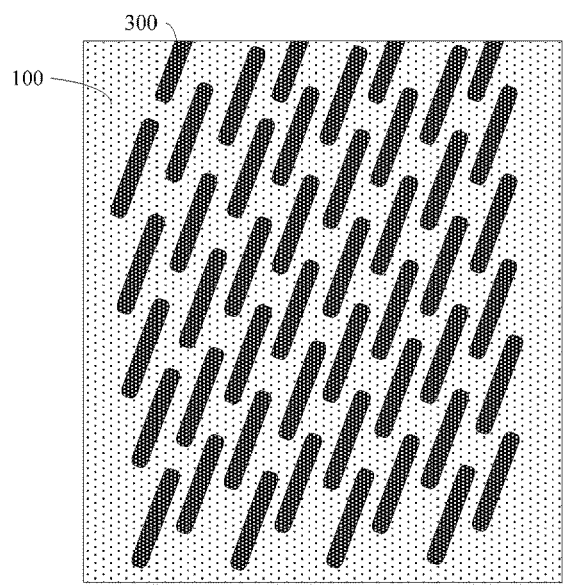
FIG. 10C is a top view illustrating a third structure obtained by the method of manufacturing a semiconductor device according to an embodiment of the present disclosure.

In some examples, referring to FIGS. 10A to 10C, the orthographic projection of the active region mask structures 300 on the bottom surface of the semiconductor substrate 100 extends in a second direction F2 and passes through the orthographic projection of the word line structures 130 on the bottom surface of the semiconductor substrate 100. In this way, the buried word lines 132 can pass through the formed active regions to form a transistor. An angle between the second direction F2 and the first direction F1 is greater than 0° and less than 90°, such that the active regions and the buried word lines 132 can have an angle greater than 0° and less than 90°. The angle between the active regions and the buried word lines 132 can be determined by those skilled in the art according to actual needs, which is not limited herein.

In some examples, the S30: form multiple active region mask structures 300 on the top surface of the semiconductor substrate 100 specifically includes the following step. First, an etch mask layer and an etch stop layer covering the semiconductor substrate 100 are formed on the semiconductor substrate 100. The etch mask layer and the etch stop layer may be made of one or more from the group consisting of silicon oxide, silicon nitride, oxynitride, silicon-based nitride and ONO. The materials of the etch mask layer and the etch stop layer may be different due to the etch selectivity. In some embodiments, a silicon nitride layer is deposited as the etch mask layer at a set deposition rate. In some embodiments, a silicon oxide layer is deposited as the etch stop layer at a set deposition rate. The deposition process may be CVD, PVD, ALD, HDPCVD, MOCVD, PECVD or other suitable deposition process well known to those skilled in the art, which is not limited herein. Similarly, the deposition rate and the thickness of the etch mask layer are determined by those skilled in the art according to actual needs.

Figure 9A:
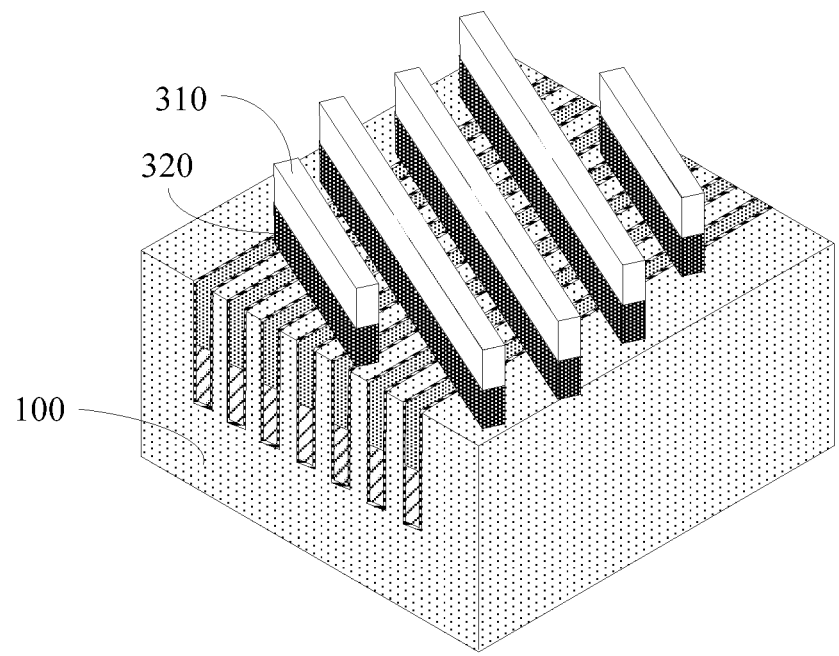
FIG. 9A is a view illustrating a third structure obtained by the method of manufacturing a semiconductor device according to an embodiment of the present disclosure.
Figure 9B:
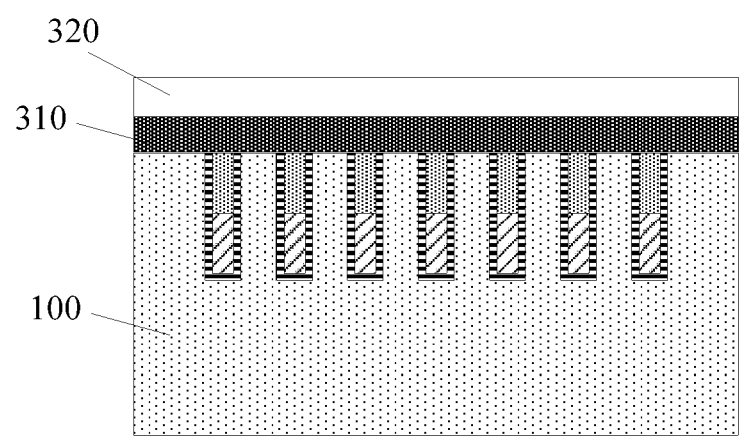
FIG. 9B is a sectional view illustrating the structure shown in FIG. 9A.

Then, referring to FIGS. 9A and 9B, the etch stop layer is patterned to form multiple stripe-shaped etch stop isolation structures 310 extending in the second direction F2. In some embodiments, a part of the etch stop layer may be removed by a vapor etching process to form the multiple stripe-shaped etch stop isolation structures 310 extending in the second direction F2. These etch stop isolation structures 310 can shield the etch mask layer corresponding to regions where the active regions are to be formed, such that a gap between adjacent etch stop isolation structures 310 exposes a region where the etch mask layer is to be removed. In some embodiments, to achieve certain etch selectivity to etch the etch mask layer, an etching gas used may be one or more from the group consisting of $SF_6$, $CF_4$, $Cl_2$, $CHF_3$, $O_2$ and Ar.

Figure 9C:
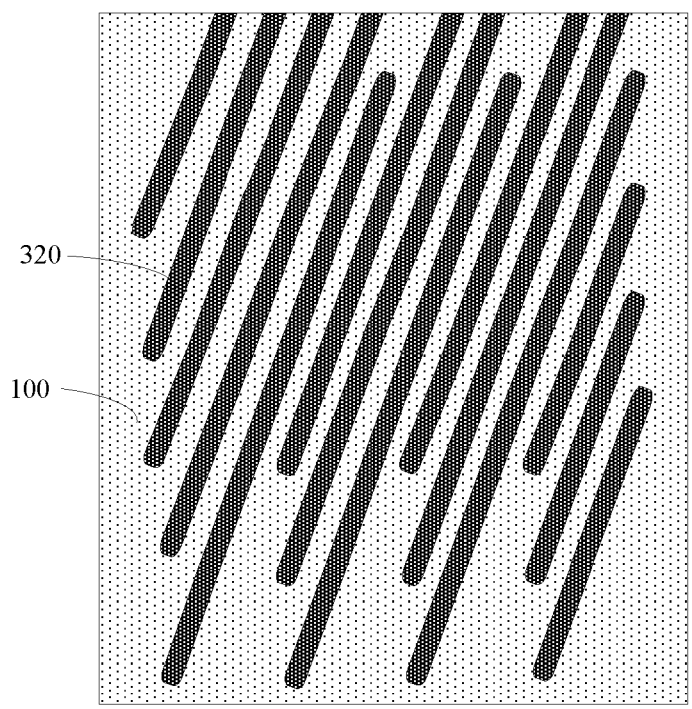
FIG. 9C is a top view illustrating a third structure obtained by the method of manufacturing a semiconductor device according to an embodiment of the present disclosure.
Figure 9D:
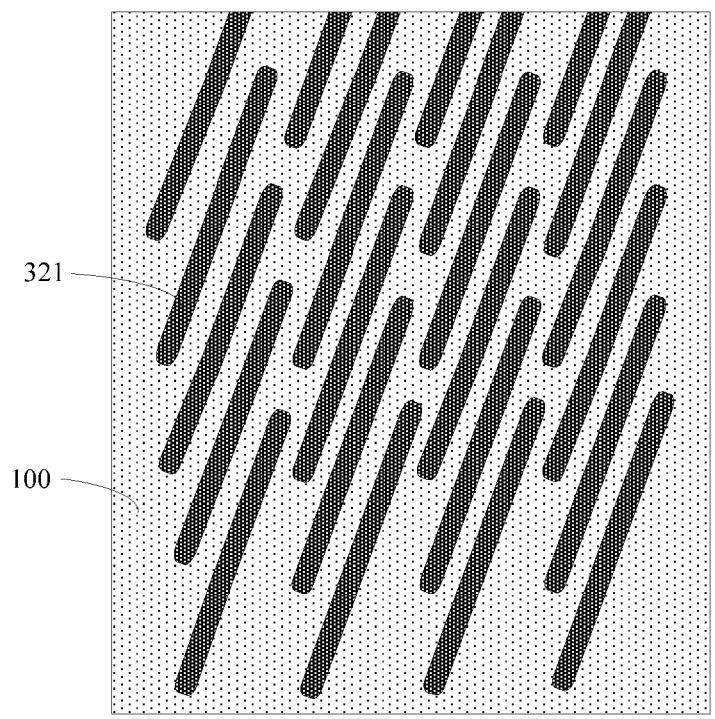
FIG. 9D is a top view illustrating a third structure obtained by the method of manufacturing a semiconductor device according to an embodiment of the present disclosure.

Referring to FIGS. 9A to 9C, by using the stripe-shaped etch stop isolation structures 310 as an etch mask, the etch mask layer is patterned to form multiple strip-shaped etch mask isolation structures 320 extending in the second direction F2. In some embodiments, the etch mask layer in the gap of the etch stop isolation structures 310 may be removed by a vapor etching process, and the etch mask layer in the remaining regions may be retained to form multiple stripe-shaped etch mask isolation structures 320 extending in the second direction F2. In this way, the gap between the adjacent etch mask isolation structure 320 exposes a region where the semiconductor substrate 100 is to be removed. In some embodiments, to achieve certain etch selectivity to etch the etch mask layer, an etching gas used may be one or more from the group consisting of $SF_6$, $CF_4$, $Cl_2$, $CHF_3$, $O_2$ and Ar.

The etch stop isolation structures 310 are further patterned so as to divide the stripe-shaped etch stop isolation structures 310 into multiple etch stop isolation structure segments. In some embodiments, a middle portion of each of the etch stop isolation structures 310 may be removed by a vapor etching process to divide the stripe-shaped etch stop isolation structure 310 into two or more etch stop isolation structure segments. Each of the etch stop isolation structure segments covers multiple active regions. A region where the etch mask layer is to be removed is exposed between the etch stop isolation structure segments of the same etch stop isolation structure 310. In some embodiments, to achieve certain etch selectivity to etch the etch mask layer, an etching gas used may be one or more from the group consisting of $SF_6$, $CF_4$, $Cl_2$, $CHF_3$, $O_2$ and Ar.

Referring to FIGS. 9A to 9C, by using the etch stop isolation structure segments as an etch mask, the etch mask isolation structures 320 are patterned so as to divide the stripe-shaped etch mask isolation structures 320 into multiple etch mask isolation structure segments 321. In some embodiments, the etch mask layer in a gap between the etch stop isolation structure segments 311 of the same etch stop isolation structure 310 may be removed by a vapor etching process, and the etch mask layer in the remaining regions is retained to divide the etch mask isolation structure 320 into multiple etch mask isolation structure segments 321. Therefore, the gap between the etch mask isolation structure segments 321 of the same etch mask isolation structure 320 exposes the region where the semiconductor substrate 100 is to be etched. In some embodiments, to achieve certain etch selectivity to etch the etch mask layer, an etching gas used may be one or more from the group consisting of $SF_6$, $CF_4$, $Cl_2$, $CHF_3$, $O_2$ and Ar.

The etch stop isolation structure segments are further patterned to divide each of the etch stop isolation structure segments into two or multiple etch stop isolation structure sub-segments. In some embodiments, a middle portion of each of the etch stop isolation structure segments may be removed by a vapor etching process to divide the etch stop isolation structure segment into two etch stop isolation structure sub-segments. Each etch stop isolation structure sub-segment covers one active region. A region where the etch mask layer is to be removed is exposed between the etch stop isolation structure sub-segments of the same etch stop isolation segment. In some embodiments, to achieve certain etch selectivity to etch the etch mask layer, an etching gas used may be one or more from the group consisting of $SF_6$, $CF_4$, $Cl_2$, $CHF_3$, $O_2$ and Ar.

Referring to FIG. 10A to FIG. 10C, by using the etch stop isolation structure sub-segments as an etch mask, the etch mask layer is patterned so as to divide each of the etch mask isolation structure segments 321 into multiple active region mask structures 300. In some embodiments, the etch mask layer in a gap between the etch stop isolation structure sub-segments of the same etch stop isolation structure 310 may be removed by a vapor etching process, and the etch mask layer in the remaining regions is retained to divide the etch mask isolation structure segment 321 into two active region mask structures 300. Therefore, the gap between the active region mask structures 300 of the same etch mask isolation structure segment 321 exposes a region where the semiconductor substrate 100 is to be etched. One active region mask structure 300 covers one active region. In some embodiments, to achieve certain etch selectivity to etch the etch mask layer, an etching gas used may be one or more from the group consisting of $SF_6$, $CF_4$, $Cl_2$, $CHF_3$, $O_2$ and Ar.

S40: Etch the word line structures 130 and the semiconductor substrate 100 by using the active region mask structures 300 as an etch mask to form the active regions 110 and the buried word line 132 passing through the active regions 110.

In some examples, the S40: etch the word line structures 130 and the semiconductor substrate 100 to form the active regions and the buried word line 132 passing through the active regions specifically include the following step. First, the semiconductor substrate, the insulating layer and the gate dielectric layer in an unmasked region are etched to expose the buried word line in the unmasked region and make the semiconductor substrate in the unmasked region flush with the bottom surface of the buried word line. The unmasked region is a region other than a region where the active region mask structure is located. Then, the semiconductor substrate in the unmasked region is etched by a set depth, such that there is the set depth between a plane where the semiconductor substrate in the unmasked region is located and a plane where the bottom surface of the buried word line is located. In some embodiments, the step that the semiconductor substrate, the insulating layer and the gate dielectric layer in an unmasked region are etched to expose the buried word line in the unmasked region and make the semiconductor substrate in the unmasked region flush with the bottom surface of the buried word line may specifically include the following step. First, the semiconductor substrate and the insulating layer in the unmasked region are etched by using the active region mask structures as an etch mask, such that in the unmasked region, the top surface of the semiconductor substrate is flush with a top surface of the buried word line. Then, by using the active region mask structure as an etch mask, the semiconductor substrate and the gate dielectric layer in the unmasked region are etched, such that in the unmasked region, the buried word line is exposed and the top surface of the semiconductor substrate is flush with the bottom surface of the buried word line. The step of exposing the buried word line in the unmasked region may specifically include the following step. By using the active region mask structure as an etch mask, the semiconductor substrate and the gate dielectric layer in the unmasked region are etched, such that in the unmasked region, the buried word line is exposed and the height of the buried word line is equal to that of the buried word line in a region where the active region mask structure is located.

Figure 11A:
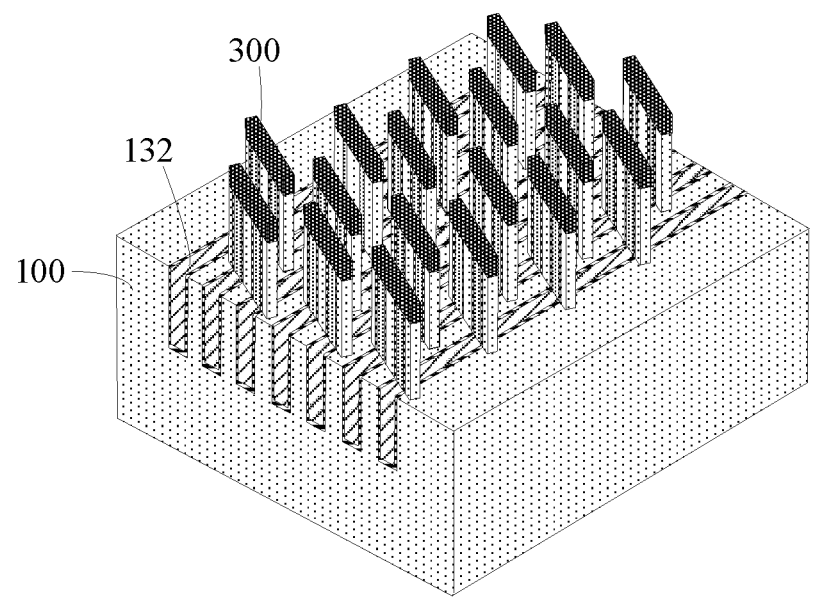
FIG. 11A is a view illustrating a third structure obtained by the method of manufacturing a semiconductor device according to an embodiment of the present disclosure.
Figure 11B:
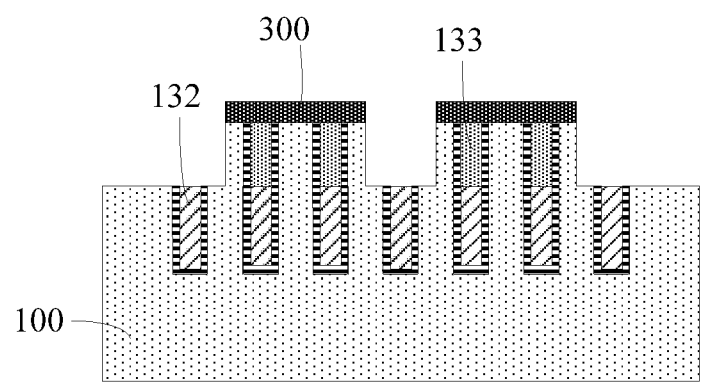
FIG. 11B is a sectional view illustrating the structure shown in FIG. 11A.

In some embodiments, step S40 may be implemented as follows:

Referring to FIGS. 11A and 11B, a region other than the region where the active region mask structure 300 is located defines an unmasked region. The semiconductor substrate 100, the insulating layer 133 and the gate dielectric layer 131 in the unmasked region are etched, and the semiconductor substrate 100, the insulating layer 133 and the gate dielectric layer 131 in the region where the active region mask structure 300 is located are retained. The top surface of the semiconductor substrate 100 in the unmasked region is flush with that of the buried word line 132. In some embodiments, the semiconductor substrate 100 and the insulating layer 133 in the unmasked region may be etched by using the active region mask structure 300 as an etch mask through a vapor etching process until the top surface of the semiconductor substrate 100 in the unmasked region is flush with that of the buried word line 132.

Figure 12A:
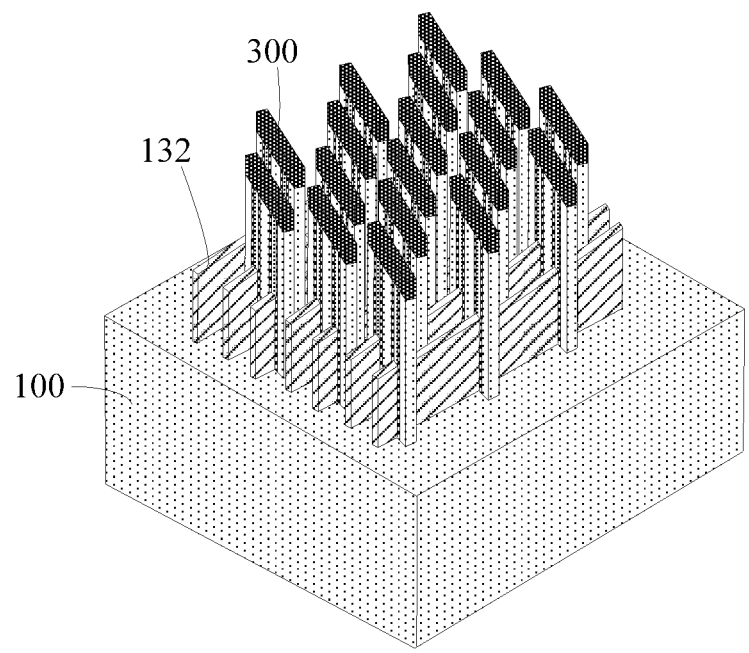
FIG. 12A is a view illustrating a third structure obtained by the method of manufacturing a semiconductor device according to an embodiment of the present disclosure.
Figure 12B:
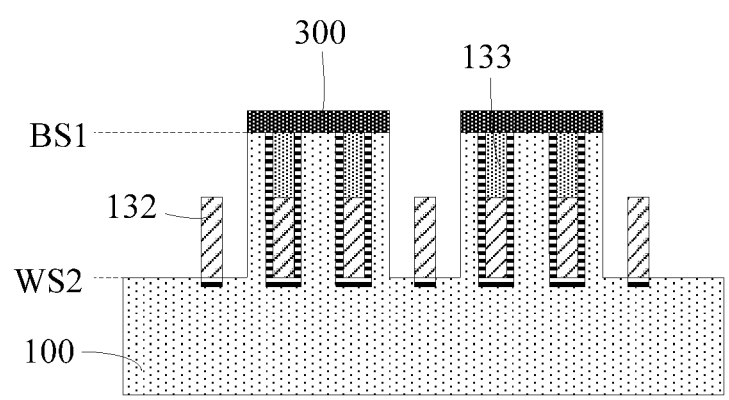
FIG. 12B is a sectional view illustrating the structure shown in FIG. 12A.

Referring to FIGS. 12A and 12B, by using the active region mask structure 300 as an etch mask, the semiconductor substrate 100 and the gate dielectric layer 131 in the unmasked region are etched. The buried word line 132 in the unmasked region is exposed, and the top surface of the semiconductor substrate 100 in the unmasked region is flush with bottom surfaces of the buried word lines 132. The height of the buried word line 132 in the unmasked region may be equal to that of the buried word line 132 in the region where the active region mask structure 300 is located.

Referring to FIGS. 12A and 12B, the semiconductor substrate 100 between a plane where the bottom surface of the active region mask structure 300 is located (that is, a plane BS1 where an uppermost surface of the semiconductor substrate is located) and a plane WS2 where a bottom surface of the buried word line 132 is located is oxidated. An oxide protection layer is formed on a surface of the semiconductor substrate 100 between the plane BS1 where the bottom surface of the active region mask structure 300 is located and the plane WS2 where the bottom surface of the buried word line 132 is located. In some embodiments, the surface of the semiconductor substrate 100 between the plane BS1 where the bottom surface of the active region mask structure 300 is located and the plane WS2 where the bottom surface of the buried word line 132 is located may be oxidated by a plasma oxidation process. The plasma oxidation process may be performed by using a mixed gas of $O_2$ and $N_2$ at 600-800° C., 600-2,000 W, and 1-10 Pa. Similarly, the parameters of the plasma oxidation process may be determined by those skilled in the art according to actual needs.

Figure 13A:
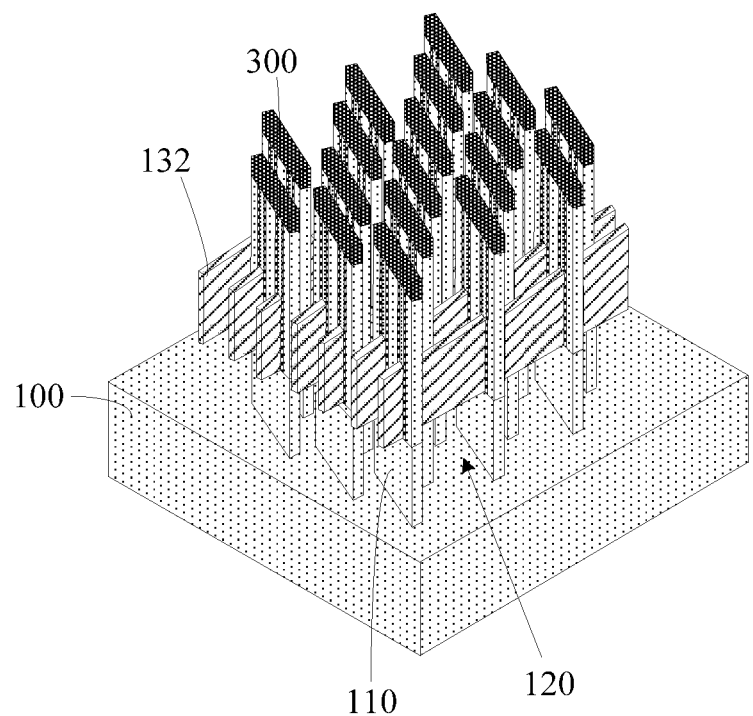
FIG. 13A is a view illustrating a third structure obtained by the method of manufacturing a semiconductor device according to an embodiment of the present disclosure.
Figure 13B:
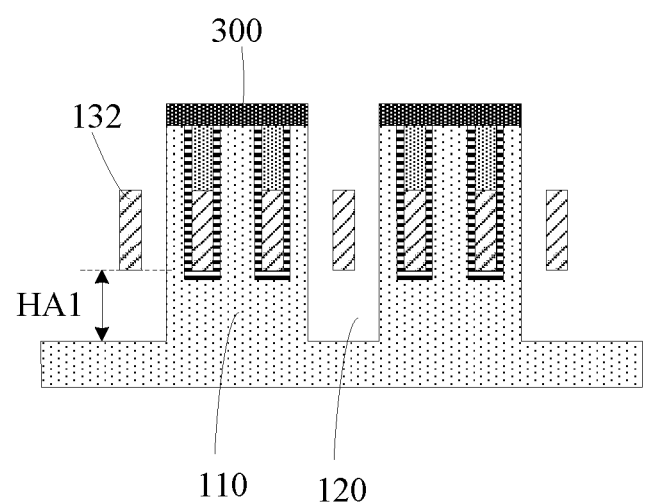
FIG. 13B is a sectional view illustrating the structure shown in FIG. 13A.

Referring to FIGS. 13A and 13B, the semiconductor substrate 100 in the unmasked region is etched by a set depth, such that there is the set depth HA1 between a plane where the semiconductor substrate 100 in the unmasked region is located and a plane where the bottom surfaces of the buried word lines 132 are located. In some embodiments, referring to FIGS. 13A and 13B, by using the active region mask structures 300 and the buried word lines 132 as an etch mask, the semiconductor substrate 100 is etched by the set depth HA1, such that there is the set depth HA1 between the plane where the etched semiconductor substrate 100 is located and the plane where the bottom surfaces of the buried word lines 132 are located. The semiconductor substrate 100 with the set depth HA1 in the regions where the buried word lines 132 are located may be subjected to preferential etching treatment. Thus, when the semiconductor substrate 100 is subsequently etched, the semiconductor substrate 100 after the preferential etching treatment may be etched first to avoid affecting the semiconductor substrate 100 under the active region mask structures 300. By etching the semiconductor substrate 100 after the preferential etching treatment, shallow trench isolation (STI) trenches 120 are formed, so as to define the active regions 110 by the STI trenches.

Figure 14A:
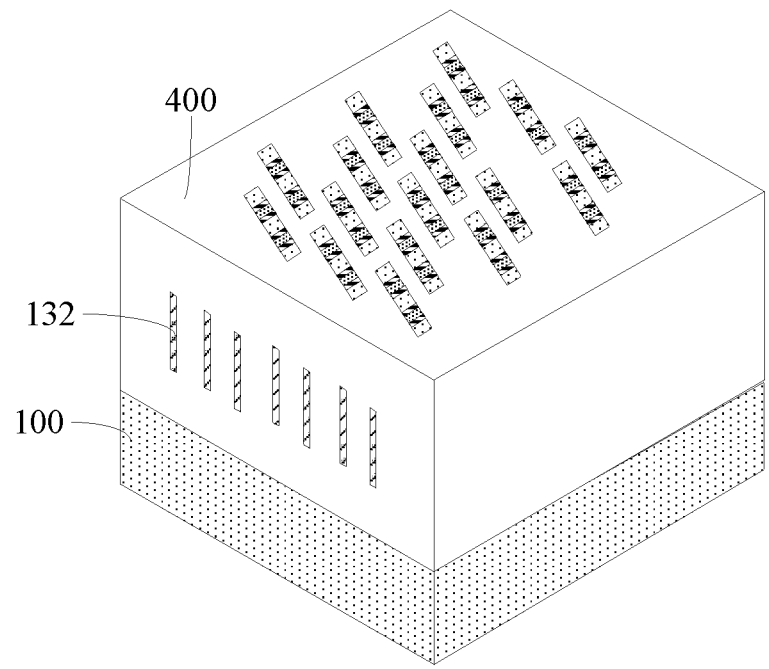
FIG. 14A is a view illustrating a first structure obtained by the method of manufacturing a semiconductor device according to an embodiment of the present disclosure.
Figure 14B:
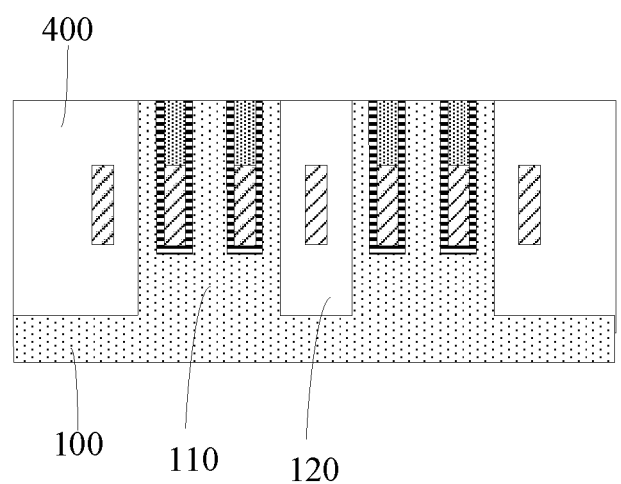
FIG. 14B is a sectional view illustrating the structure shown in FIG. 14A.

In some examples, referring to FIGS. 14A and 14B, after forming the active regions 110 and the buried word lines 132 passing through the active regions 110, the method of manufacturing a semiconductor device may further include: deposit an isolation layer 400 on the semiconductor substrate 100, where the isolation layer 400 is flush with the top surface of the semiconductor substrate 100. The isolation layer 400 is vapor-etched to expose the buried word lines and the active regions for subsequent electrical connection. The isolation layer may be made of one or more from the group consisting of silicon oxide, silicon nitride, oxynitride, silicon-based nitride and ONO. In some embodiments, a silicon oxide layer is deposited as the isolation layer at a set deposition rate. The deposition process may be CVD, PVD, ALD, HDPCVD, MOCVD, PECVD or other suitable deposition process well known to those skilled in the art, which is not limited herein. Similarly, the deposition rate and the thickness of the isolation layer are determined by those skilled in the art according to actual needs. In some embodiments, to achieve certain etch selectivity to etch the isolation layer, an etching gas used may be one or more from the group consisting of $SF_6$, $CF_4$, $Cl_2$, $CHF_3$, $O_2$ and Ar.

In some embodiments, multiple bit line structures intersecting with the corresponding active regions 110 may also be formed on the semiconductor substrate 100. In this way, a source/drain region of a transistor (that is, a portion between two adjacent word line structures 130 on the semiconductor substrate 100) is electrically connected to a corresponding bit line structure.

Figure 14C:
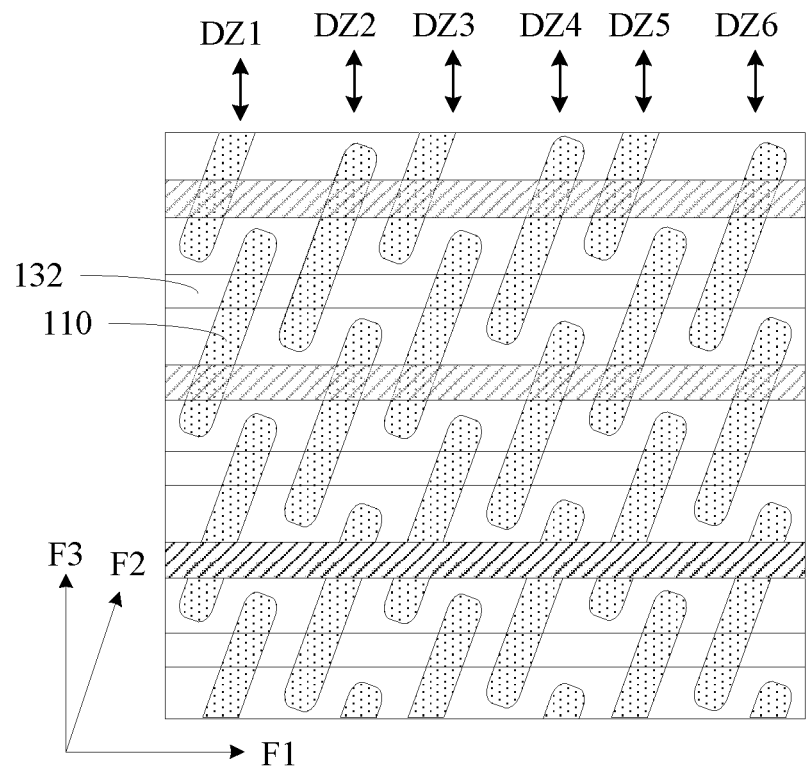
FIG. 14C is a top view illustrating a third structure obtained by the method of manufacturing a semiconductor device according to an embodiment of the present disclosure.

The present disclosure provides a semiconductor device manufactured by using the above method of manufacturing a semiconductor device. The semiconductor device may be, for example, a dynamic random access memory (DRAM). Referring to FIGS. 14A to 14C, the semiconductor device provided by the present disclosure may include: a semiconductor substrate 100 and word line structures 130. The semiconductor substrate 100 is provided with isolation regions 120 formed by STI trenches and multiple active regions 110 defined by the isolation regions 120. A memory cell of, for example, the DRAM, may be formed in each of the active regions 110. The semiconductor substrate 100 is provided with word line structures 130, which intersect the corresponding active regions 110 and are buried in the semiconductor substrate 100. The word line structures 130 are in contact with the semiconductor substrate 100. The word line structures 130 each may include: a gate dielectric layer 131, multiple buried word lines 132 and an insulating layer 133. For example, when the word line structures 130 are formed in the word line trenches 101, the gate dielectric layer 131, the buried word lines 132 and the insulating layer 133 covering the buried word lines 132 may be sequentially formed in the word line trenches 101. The buried word lines 132 extend in a first direction F1. Orthographic projection of the active regions on a bottom surface of the semiconductor substrate 100 extends in a second direction F2 and passes through orthographic projection of the buried word lines 132 on the bottom surface of the semiconductor substrate 100. Orthographic projection of the insulating layer 133 and the gate dielectric layer 131 on the bottom surface of the semiconductor substrate 100 is located within the orthographic projection of the active regions on the bottom surface of the semiconductor substrate 100. The insulating layer 133 is located on the buried word lines 132, and the orthographic projection of the insulating layer 133 and the buried word lines 132 in the active regions on the bottom surface of the semiconductor substrate 100 overlap. The orthographic projection of the gate dielectric layer 131 on the bottom surface of the semiconductor substrate 100 is located on two sides of the orthographic projection of the insulating layer 133 in the active regions on the bottom surface of the semiconductor substrate 100. For example, the buried word lines 132 in the word line structures 130 may serve as a gate of a transistor in the memory, and source/drain regions of the transistor may be located in the active regions 110 on two sides of the word line structures 130. For example, one of the source/drain regions, such as a source/drain region between two word line structures 130, may serve as a source of the corresponding transistor, and the other source/drain region, such as a source/drain region between the word line structure 130 and the isolation region 120, may serve as a drain of the corresponding transistor.

In some examples, referring to FIGS. 13A to 14C, the active regions are arranged in a third direction F3 to form repeating units, and the repeating units are arranged in the first direction F1. The active regions in every two adjacent repeating units are arranged in a staggered manner. In some embodiments, the active regions in a repeating unit DZ1 and a repeating unit DZ2 are arranged in a staggered manner. The active regions in a repeating unit DZ2 and a repeating unit DZ3 are arranged in a staggered manner. The active regions in a repeating unit DZ3 and a repeating unit DZ4 is arranged in a staggered manner. The active regions in a repeating unit DZ4 and a repeating unit DZ5 are arranged in a staggered manner. The active regions in a repeating unit DZ5 and a repeating unit DZ6 are arranged in a staggered manner. In some embodiments, the repeating units in odd-numbered columns (such as DZ1, DZ3, DZ5) are arranged in the same pattern in the first direction F1, and the repeating units in even-numbered columns (such as DZ2, DZ4, DZ6) are arranged in the same pattern in the first direction F1.

In some examples, referring to FIGS. 13A to 14C, one active region may be passed through by two buried word lines 132. For example, each active region is passed through by two buried word lines 132. In some embodiments, each of the buried word line 132 may alternately pass through the active regions in odd-numbered and the active regions in even-numbered repeating units.

In some examples, referring to FIG. 13A to FIG. 14B, other regions except the active regions are taken as non-active regions, and the height of the buried word lines 132 in the non-active regions may be equal to that of the buried word lines 132 in the active regions. In this way, the buried word lines 132 in each part can be evenly distributed.

An embodiment of the present disclosure further provides a method of manufacturing a semiconductor device, which modifies the implementations in the above-mentioned embodiment. The differences between this embodiment and the above-mentioned embodiment are described below, but the similarities are not repeated here.

Referring to FIGS. 15A to 16B, in the semiconductor device provided by the embodiment of the present disclosure, the height of the buried word lines 132 in the non-active regions may be less than that of the buried word lines 132 in the active regions 110. In this way, the relative area between the buried word lines 132 in the non-active regions is reduced, thereby reducing the coupling capacitance between the buried word lines 132 in the non-active regions and further reducing signal interference. In some embodiments, the heights of the buried word lines 132 in the active regions may be equal. In some embodiments, the heights of the buried word lines 132 in the non-active regions may be equal. In some embodiments, the semiconductor substrate 100 and the gate dielectric layer 131 in an unmasked region are etched by using the active region mask structure 300 as an etch mask. In this way, the top surface of the semiconductor substrate 100 in the unmasked region is flush with a bottom surface of the buried word line 132, and the height of the buried word line 132 in the unmasked region is less than that of the buried word line 132 in a region where the active region mask structure 300 is located.

In some examples, step S40 may also be implemented as follows:

Referring to FIGS. 11A and 11B, a region other than that where the active region mask structure 300 is located defines an unmasked region. The semiconductor substrate 100, the insulating layer 133 and the gate dielectric layer 131 in the unmasked region are etched, and the semiconductor substrate 100, the insulating layer 133 and the gate dielectric layer 131 in the region where the active region mask structure 300 is located are retained. The top surface of the semiconductor substrate 100 in the unmasked region is flush with that of the buried word line 132. In some embodiments, the semiconductor substrate 100 and the insulating layer 133 in the unmasked region may be etched by using the active region mask structure 300 as an etch mask through a vapor etching process until the top surface of the semiconductor substrate 100 in the unmasked region is flush with that of the buried word line 132.

Referring to FIGS. 12A and 12B, by using the active region mask structure 300 as an etch mask, the semiconductor substrate 100 and the gate dielectric layer 131 in the unmasked region are etched. The buried word line 132 in the unmasked region is exposed, and the top surface of the semiconductor substrate 100 in the unmasked region is flush with a bottom surface of the buried word line 132. The height of the buried word line 132 in the unmasked region may be equal to that of the buried word line 132 in the region where the active region mask structure 300 is located.

Figure 15A:
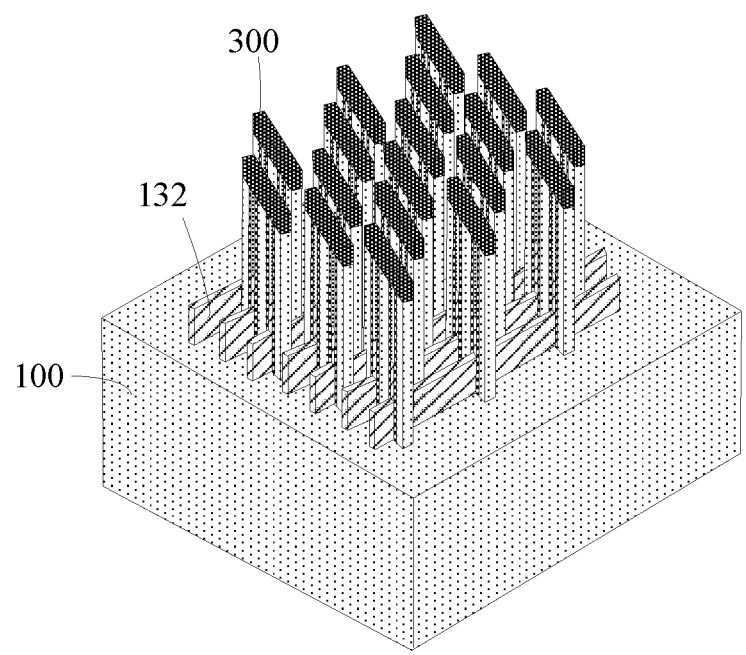
FIG. 15A is a view illustrating a third structure obtained by the method of manufacturing a semiconductor device according to an embodiment of the present disclosure.
Figure 15B:
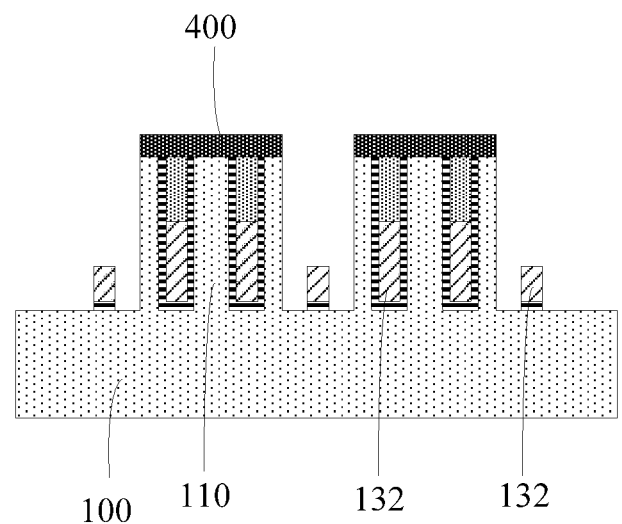
FIG. 15B is a sectional view illustrating the structure shown in FIG. 15A.

Referring to FIGS. 15A and 15B, the buried word line 132 in the unmasked region is etched by using the active region mask structure 300 as an etch mask. In this way, the height of the buried word line 132 in the unmasked region is less than that of the buried word line 132 in the region where the active region mask structure 300 is located. In some embodiments, the buried word line 132 in the unmasked region may be removed by a vapor etching process, such that the height of the buried word line 132 in the unmasked region is less than that of the buried word line 132 in the region where the active region mask structure 300 is located. In some embodiments, to achieve certain etch selectivity to etch the buried word line, an etching gas used may be one or more from the group consisting of $SF_6$, $CF_4$, $Cl_2$, $CHF_3$, $O_2$ and Ar. It should be noted that the height of the buried word line 132 in the unmasked region may be set according to an actual application environment, which is not limited here.

According to the above-mentioned method of manufacturing a semiconductor device, oxidation treatment is performed on the semiconductor substrate 100 between a plane where the bottom surface of the active region mask structure 300 is located and a plane where the bottom surface of the buried word line 132 is located. An oxide protection layer is formed on a surface of the semiconductor substrate 100 between the plane where the bottom surface of the active region mask structure 300 is located and the plane where the bottom surface of the buried word line 132 is located. In some embodiments, the surface of the semiconductor substrate 100 between the plane where the bottom surface of the active region mask structure 300 is located and the plane where the bottom surface of the buried word line 132 is located may be oxidated by a plasma oxidation process. The plasma oxidation process may be performed by using a mixed gas of $O_2$ and $N_2$ at 600-800° C., 600-2000 W, and 1-10 Pa. Similarly, the parameters of the plasma oxidation process may be determined by those skilled in the art according to actual needs.

According to the above-mentioned method of manufacturing a semiconductor device, the semiconductor substrate 100 in the unmasked region is etched by a set depth, such that there is the set depth HA1 between a plane where the semiconductor substrate 100 in the unmasked region is located and the plane where the bottom surface of the buried word line 132 is located. In some embodiments, referring to FIGS. 13A and 13B, by using the active region mask structure 300 and the buried word line 132 as an etch mask, the semiconductor substrate 100 is etched by the set depth HAL such that there is the set depth HA1 between the plane where the etched semiconductor substrate 100 is located and the plane where the bottom surface of the buried word line 132 is located. The semiconductor substrate 100 with the set depth HA1 in the region where the buried word line 132 is located may be subjected to preferential etching treatment. Thus, when the semiconductor substrate 100 is subsequently etched, the semiconductor substrate 100 after the preferential etching treatment may be etched first to avoid affecting the semiconductor substrate 100 under the active region mask structure 300. By etching the semiconductor substrate 100 after the preferential etching treatment, shallow trench isolation (STI) trenches 120 are formed, so as to define the active regions 110 by the STI trenches.

Figure 16A:
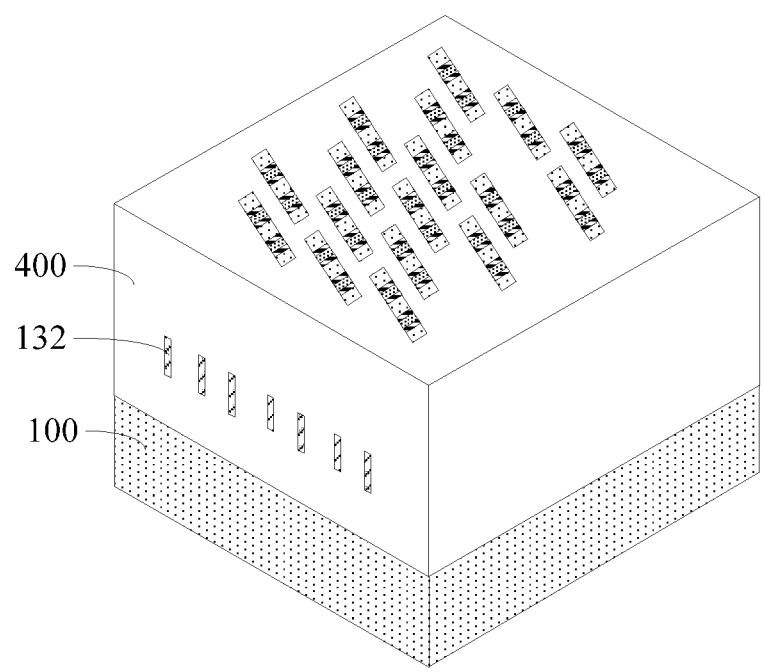
FIG. 16A is a view illustrating a third structure obtained by the method of manufacturing a semiconductor device according to an embodiment of the present disclosure.
Figure 16B:
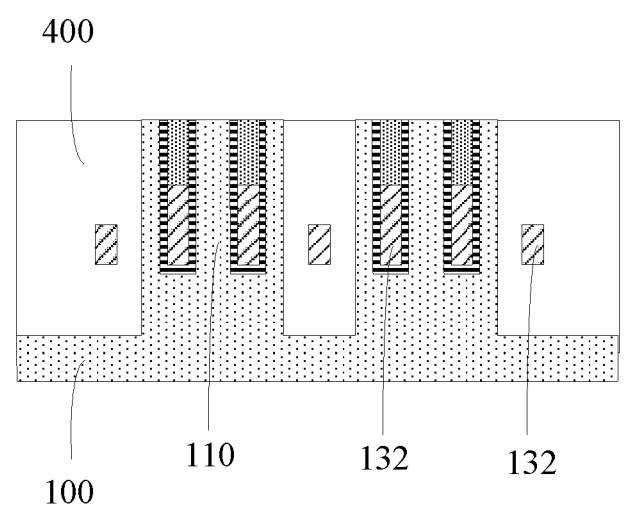
FIG. 16B is a sectional view illustrating the structure shown in FIG. 16A.

In some examples, referring to FIGS. 16A and 16B, an isolation layer is deposited on the semiconductor substrate 100, such that the isolation layer is flush with the top surface of the semiconductor substrate 100. The isolation layer 400 is vapor-etched to expose the buried word lines and the active regions for subsequent electrical connection. The isolation layer may be made of one or more from the group consisting of silicon oxide, silicon nitride, oxynitride, silicon-based nitride and ONO. In some embodiments, a silicon oxide layer is deposited as the isolation layer at a set deposition rate. The deposition process may be CVD, PVD, ALD, HDPCVD, MOCVD, PECVD or other suitable deposition process well known to those skilled in the art, which is not limited herein. Similarly, the deposition rate and the thickness of the isolation layer are determined by those skilled in the art according to actual needs. In some embodiments, to achieve certain etch selectivity to etch the isolation layer, an etching gas used may be one or more from the group consisting of $SF_6$, $CF_4$, $Cl_2$, $CHF_3$, $O_2$ and Ar.

An embodiment of the present disclosure further provides an electronic device. The electronic device may include the above-mentioned semiconductor device provided by the embodiment of the present disclosure. The principle of the electronic device to solve the problem is similar to the above-mentioned semiconductor device. Therefore, the implementation of the electronic device may refer to the implementation of the above-mentioned semiconductor device, which will not be repeated here.

In a specific implementation, in the embodiment of the present disclosure, the electronic device may be any product or component with a storage function, such as a mobile phone or a tablet computer. Other indispensable components of the electronic device are understandable by those of ordinary skill in the art, which will not be repeated here, but this should not be construed as a limitation to the present disclosure.

Apparently, those skilled in the art can make various modifications and variations to the present disclosure without departing from the spirit and scope of the present disclosure. The present disclosure is intended to cover these modifications and variations provided that they fall within the scope of protection defined by the claims of the present disclosure or equivalents thereof.

The invention claimed is:

1. A method of manufacturing a semiconductor device, comprising:
    forming multiple word line trenches on a semiconductor substrate, wherein the word line trenches extend in a first direction;
    forming a word line structure in each of the word line trenches, wherein a top surface of the word line structure is flush with a top surface of the semiconductor substrate, wherein the word line structure comprises a gate dielectric layer, a buried word line and an insulating layer on the buried word line, wherein a top surface of the insulating layer is flush with the top surface of the semiconductor substrate;
    forming multiple active region mask structures on the top surface of the semiconductor substrate, wherein the active region mask structures define active regions in the semiconductor substrate; and orthographic projection of the active region mask structures on a bottom surface of the semiconductor substrate extends in a second direction and passes through orthographic projection of the word line structures on the bottom surface of the semiconductor substrate; and
    etching the word line structures and the semiconductor substrate by using the active region mask structures as an etch mask to form the active regions and buried word lines passing through the active regions;
    wherein the etching the word line structures and the semiconductor substrate to form the active regions and buried word lines passing through the active regions comprises: etching, in an unmasked region, the semiconductor substrate, the insulating layer and the gate dielectric layer, exposing the buried word line in the unmasked region, such that in the unmasked region, the top surface of the semiconductor substrate is flush with a bottom surface of the buried word line, wherein the unmasked region is a region other than a region where the active region mask structure is located; and etching the semiconductor substrate in the unmasked region by a set depth, such that there is the set depth between the top surface of the semiconductor substrate and the bottom surface of the buried word line, in the unmasked region.

2. The method of manufacturing a semiconductor device according to claim 1, wherein the forming a word line structure in each of the word line trenches comprises:
    forming the gate dielectric layer on sidewalls of each of the word line trenches;
    filling the buried word line in each of the word line trenches forming the gate dielectric layer, wherein a top surface of the buried word line is lower than the top surface of the semiconductor substrate; and
    filling the insulating layer on the buried word line in each of the word line trenches.

3. The method of manufacturing a semiconductor device according to claim 1, wherein the etching, in an unmasked region, the semiconductor substrate, the insulating layer and the gate dielectric layer, exposing the buried word line in the unmasked region, such that in the unmasked region, the semiconductor substrate is flush with the bottom surface of the buried word line comprises:
    etching, in the unmasked region, the semiconductor substrate and the insulating layer by using the active region mask structure as an etch mask, such that in the unmasked region, the top surface of the semiconductor substrate is flush with the top surface of the buried word line; and
    etching, in the unmasked region, the semiconductor substrate and the gate dielectric layer by using the active region mask structure as an etch mask, exposing the buried word line in the unmasked region, such that in the unmasked region, the top surface of the semiconductor substrate is flush with the bottom surface of the buried word line.

4. The method of manufacturing a semiconductor device according to claim 3, wherein the exposing the buried word line in the unmasked region comprises:
    etching, in the unmasked region, the semiconductor substrate and the gate dielectric layer by using the active region mask structure as an etch mask, exposing the buried word line in the unmasked region, such that in the unmasked region, a height of the buried word line is equal to a height of the buried word line in the region where the active region mask structure is located.

5. The method of manufacturing a semiconductor device according to claim 3, wherein the exposing the buried word line in the unmasked region comprises:
    etching, in the unmasked region, the semiconductor substrate and the gate dielectric layer by using the active region mask structure as an etch mask, exposing the buried word line in the unmasked region, such that in the unmasked region, the top surface of the semiconductor substrate is flush with the bottom surface of the buried word line, and a height of the buried word line is equal to a height of the buried word line in the region where the active region mask structure is located; and
    etching the buried word line in the unmasked region by using the active region mask structure as an etch mask, such that the height of the buried word line in the unmasked region is less than the height of the buried word line in the region where the active region mask structure is located.

6. The method of manufacturing a semiconductor device according to claim 1, wherein after etching such that the semiconductor substrate is flush with the bottom surface of the buried word line, and before etching such that there is the set depth between the top surface of the semiconductor substrate and the bottom surface of the buried word line, the method of manufacturing a semiconductor device further comprises:

performing oxidation treatment on the semiconductor substrate between a plane where a bottom surface of the active region mask structure is located and a plane where the bottom surface of the buried word line is located, such that an oxide protection layer is formed on a surface of the semiconductor substrate.

7. The method of manufacturing a semiconductor device according to claim 6, wherein the etching the semiconductor substrate in the unmasked region by the set depth, such that there is the set depth between the top surface of the semiconductor substrate and the bottom surface of the buried word line, in the unmasked region comprises:

etching the semiconductor substrate by the set depth by using the active region mask structure and the buried word line as an etch mask, such that there is the set depth between the top surface of the semiconductor substrate and the bottom surface of the buried word line after etching;

performing etching treatment on the semiconductor substrate with the set depth in a region where the buried word line is located; and etching and removing the semiconductor substrate after the etching treatment to form a shallow trench isolation trench.

8. The method of manufacturing a semiconductor device according to claim 1, wherein the forming multiple word line trenches on a semiconductor substrate comprises:

forming, on the semiconductor substrate, a trench mask layer covering the semiconductor substrate;

patterning the trench mask layer, to form multiple strip-shaped trench mask structures; and removing the semiconductor substrate in a gap between adjacent strip-shaped trench mask structures by a set depth, to form the multiple word line trenches.

9. The method of manufacturing a semiconductor device according to claim 1, wherein after the forming the active regions and buried word lines passing through the active regions, the method of manufacturing a semiconductor device further comprises:

depositing an isolation layer on the semiconductor substrate, such that the isolation layer is flush with the top surface of the semiconductor substrate.

10. A semiconductor device, manufactured by the method of manufacturing a semiconductor device according to claim 1, wherein the semiconductor device comprises:

a semiconductor substrate, provided with isolation regions formed by shallow trench isolation trenches and multiple active regions defined by the isolation regions; and multiple buried word lines, buried in word line trenches formed by etching the semiconductor substrate, wherein the buried word lines intersect with the corresponding active regions.

11. The semiconductor device according to claim 10, wherein regions other than the active regions serve as non-active regions, and a height of the buried word lines in the non-active regions is less than or equal to a height of the buried word lines in the active regions.

12. The semiconductor device according to claim 10, wherein an oxide protection layer is formed on a surface of the semiconductor substrate between a plane where a top surface of the semiconductor substrate corresponding to the active regions is located and a plane where bottom surfaces of the buried word lines are located.

13. The semiconductor device according to claim 10, wherein the active regions are arranged in a third direction to form repeating units; the repeating units are arranged in a first direction; and the active regions in every two adjacent repeating units are arranged in a staggered manner; and each of the buried word lines alternately passes through the active regions in odd-numbered repeating units and the active regions in even-numbered repeating units.

14. An electronic device, comprising the semiconductor device according to claim 10.

* * * * *